US008878450B2

(12) United States Patent
Schubert et al.

(10) Patent No.: US 8,878,450 B2
(45) Date of Patent: Nov. 4, 2014

(54) LIGHT EMISSION SYSTEMS HAVING NON-MONOCHROMATIC EMITTERS AND ASSOCIATED SYSTEMS AND METHODS

(75) Inventors: Martin F. Schubert, Boise, ID (US); Anil Tipirneni, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 13/302,802

(22) Filed: Nov. 22, 2011

(65) Prior Publication Data

US 2013/0127365 A1 May 23, 2013

(51) Int. Cl.
*H05B 37/02* (2006.01)
*H05K 13/00* (2006.01)
*H05B 33/08* (2006.01)

(52) U.S. Cl.
CPC .................................. *H05B 33/0857* (2013.01)
USPC ............ 315/250; 315/152; 315/153; 315/155

(58) Field of Classification Search
USPC ................. 315/250, 291, 297, 152, 153, 155; 362/231
See application file for complete search history.

(56) References Cited

U.S. PATENT DOCUMENTS 6,084,250 A 7/2000 Justel et al.
7,607,797 B2 10/2009 Walter et al.
7,719,016 B2 5/2010 Nada et al.
7,967,652 B2 6/2011 Emerson
2006/0290685 A1 12/2006 Nagakubo
2007/0268694 A1 11/2007 Bailey et al.
2008/0101064 A1* 5/2008 Draganov et al. ............. 362/231
2009/0058322 A1* 3/2009 Toma et al. ................... 315/297
2010/0201274 A1* 8/2010 Deixler .......................... 315/152
2011/0199753 A1 8/2011 Ramer et al.
2011/0210678 A1 9/2011 Grajcar
2011/0215725 A1 9/2011 Paolini

FOREIGN PATENT DOCUMENTS

WO 2009140947 A2 11/2009

* cited by examiner

*Primary Examiner* — Daniel D Chang
(74) *Attorney, Agent, or Firm* — Perkins Coie LLP

(57) ABSTRACT

Emission systems having solid-state transducers (SSTs) for producing a target chromaticity of light are disclosed herein. An emission system or SST device in accordance with a particular embodiment can include a first emitter having a first plurality of SSTs positioned to emit light having a first chromaticity, and a second emitter having a second plurality of SSTs positioned to emit light having a second chromaticity different than the first chromaticity. The SST device can further include a controller having a first channel with a variable output, coupled to the first emitter to adjust the brightness level of the first emitter, and a second channel with a variable output, coupled to the second emitter to adjust the brightness level of the second emitter.

30 Claims, 11 Drawing Sheets

LIGHT EMISSION SYSTEMS HAVING NON-MONOCHROMATIC EMITTERS AND ASSOCIATED SYSTEMS AND METHODS

TECHNICAL FIELD

The present technology is related to light emission systems and methods of designing and manufacturing light emission systems. In particular, the present technology relates to multiple emitter lighting systems having non-monochromatic emitters and associated systems and methods.

BACKGROUND

Solid state lighting ("SSL") devices are used in a wide variety of products and applications. For example, mobile phones, personal digital assistants ("PDAs"), digital cameras, MP3 players, and other portable electronic devices utilize SSL devices for backlighting. SSL devices are also used for signage, indoor lighting, outdoor lighting, and other types of general illumination. SSL devices generally use light emitting diodes ("LEDs"), organic light emitting diodes ("OLEDs"), and/or polymer light emitting diodes ("PLEDs") as sources of illumination, rather than electrical filaments, plasma, or gas. FIG. 1A is a cross-sectional view of a conventional SSL device 10*a* with lateral contacts. As shown in FIG. 1A, the SSL device 10*a* includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The SSL device 10*a* also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. In operation, electrical power is provided to the SSL device 10*a* via the contacts 17, 19, causing the active region 14 to emit light.

FIG. 1B is a cross-sectional view of another conventional LED device 10*b* in which the first and second contacts 17 and 19 are opposite each other, e.g., in a vertical rather than lateral configuration. During formation of the LED device 10*b*, a growth substrate (not shown), similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate is removed, allowing the second contact 19 to be disposed on the N-type GaN 15. The structure is then inverted to produce the orientation shown in FIG. 1B. In the LED device 10*b*, the first contact 17 typically includes a reflective and conductive material (e.g., silver or aluminum) to direct light toward the N-type GaN 15. A converter material 23 and an encapsulant 25 can then be positioned over one another on the LED structure 11. In operation, the LED structure 11 can emit a first emission (e.g., blue light) that stimulates the converter material 23 (e.g., phosphor) to emit a second emission (e.g., yellow light). The combination of the first and second emissions can generate a desired color of light (e.g., white light).

SSL or LED devices similar to the SSL device 10*a* and the LED device 10*b* of FIG. 1A and FIG. 1B, respectively, can be included in LED devices having additional components. FIG. 1C is a partially schematic isometric view of a conventional SSL or LED device 30*a*. As shown in FIG. 1C, the LED device 30*a* includes a controller 32, a first LED 34*a*, a second LED 34*b* and a third LED 34*c* (collectively, LEDs 34). The LED device 30*a* can be connected to a power source (not shown) through the contacts 36. The power source and the controller 32 provide electrical signals to produce emissions from the LEDs 34 through a first channel 35*a*, a second channel 35*b* and a third channel 35*c*.

In many conventional lighting systems, the LEDs 34 are monochromatic emitters that produce either red, green or blue light. For example, the first LED 34*a* can be red, the second LED 34*b* can be green and the third LED 34*c* can be blue. By controlling the signals sent to the individual LEDs 34, the LED device 30*a* can produce a variety of different colors. In one example, a mixture of similar intensity or brightness from the LEDs 34 can produce an overall emission that is generally white. However, most chromaticities generally require unique brightness levels for each of the LEDs 34. Devices similar to the LED device 30*a* are often constructed at the chip level with multiple LED devices 30*a* on one chip. Providing individual control circuits for each individual LED device 30*a* increases manufacturing complexity and cost. Other LED devices have multiple individual LEDs that can be controlled on a single channel, thereby allowing a single controller to operate a much larger number of LEDs 34.

FIG. 1D is a partially schematic isometric view of another conventional LED device 30*b* including a first LED package 38*a* having a plurality of first LEDs 34*a*, a second LED package 38*b* having a plurality of second LEDs 34*b* and a third LED package 38*c* having a plurality of third LEDs 34*c*. The LED device 30*b* further includes a controller 32 and external contacts 36. Similar to the LED device 30*a* shown in FIG. 1C, the first LEDs 34*a* can be red, the second LEDs 34*b* can be green and the third LEDs 34*c* can be blue. The first channel 35*a*, the second channel 35*b* and the third channel 35*c* control a plurality of individual LEDs 34 for each LED package 38*a*, 38*b*, 38*c*. By varying the signals to the individual LED packages 38*a*, 38*b*, 38*c* the LED device 30*b* can also produce a variety of chromaticities of light.

Generally, the controller 32 can provide a finite number of control signals that each correspond to a potential intensity or brightness of the individual LEDs 34. Each combination of brightness levels from the LEDs 34 corresponds to a different chromaticity. Accordingly, the LED devices 30*a* and 30*b* are capable of producing a finite variety of chromaticities of light that is limited by the combinations of available control signals. Additionally, if the overall intensity or brightness of the emitted light is lowered, the available chromaticities can be substantially limited. Accordingly, there exists a need for light emission systems having an increased fidelity over a broad brightness range.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views.

DETAILED DESCRIPTION

Specific details of several embodiments of solid-state transducer ("SST") devices and associated systems and methods are described below. The term "SST" generally refers to solid-state devices that include a semiconductor material as the active medium to convert electrical energy into electromagnetic radiation in the visible, ultraviolet, infrared, and/or other spectra. For example, SSTs include solid-state light emitters (e.g., LEDs or laser diodes) and/or other sources of emission other than electrical filaments, plasmas, or gases. SSTs can alternately include solid-state devices that convert electromagnetic radiation into electricity. Accordingly, although the term LED may be used in various descriptions of embodiments of the present technology, it is to be understood that other embodiments can include other SST or SSL devices. Additionally, depending upon the context in which it is used, the term "emitter" can refer to a wafer-level assembly of multiple SSTs or to a singulated SST. A person skilled in the relevant art will also understand that the technology may have additional embodiments, and that the technology may be practiced without several of the details of the embodiments described below with reference to FIGS. 4-11.

Figure 1A:
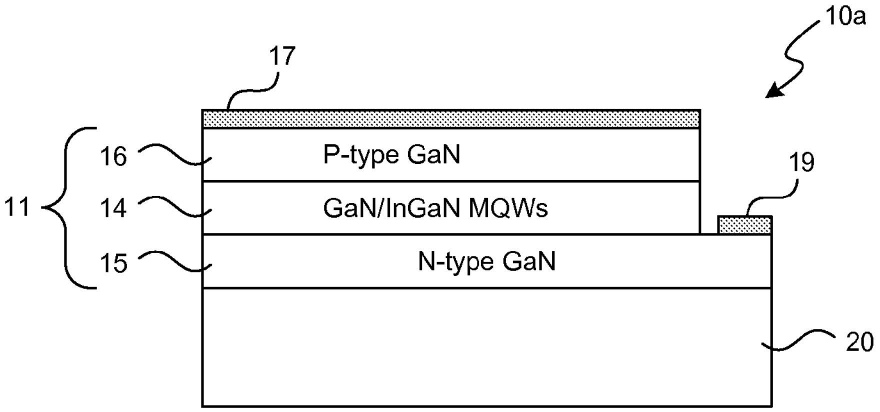
FIG. 1A (Prior Art)
FIGS. 1A and 1B are schematic cross-sectional diagrams of LED devices configured in accordance with the prior art.
Figure 1B:
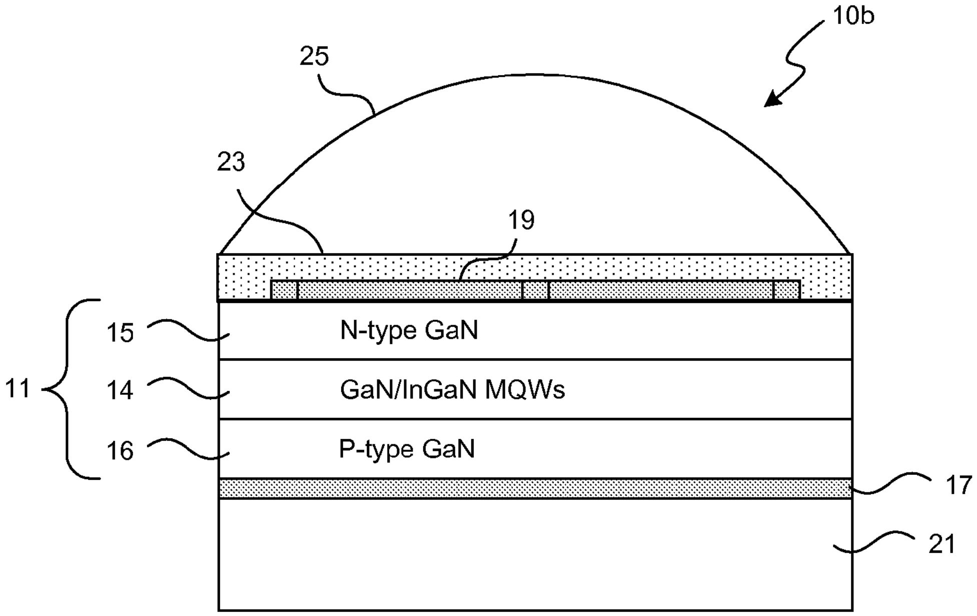
FIG. 1B (Prior Art)
Figure 1C:
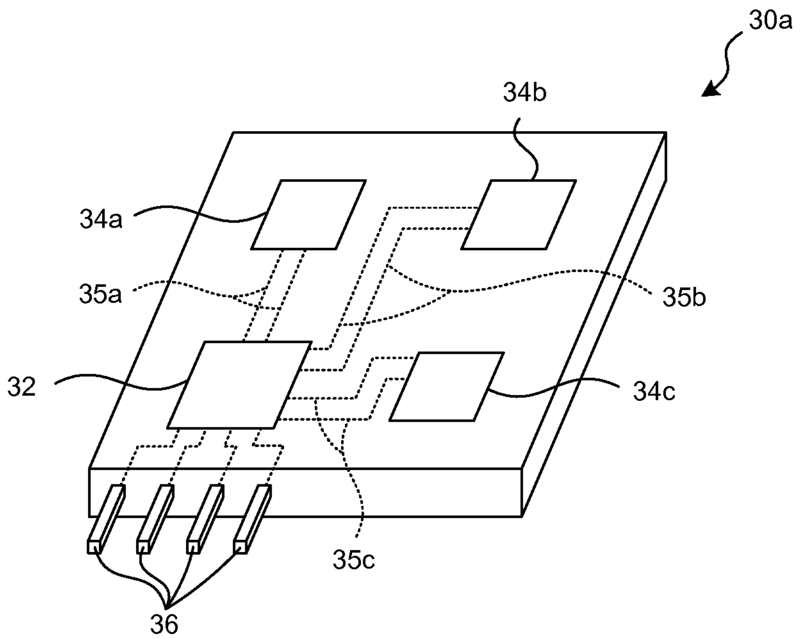
FIG. 1C (Prior Art)
FIGS. 1C and 1D are partially schematic isometric views of LED devices configured in accordance with the prior art.
Figure 1D:
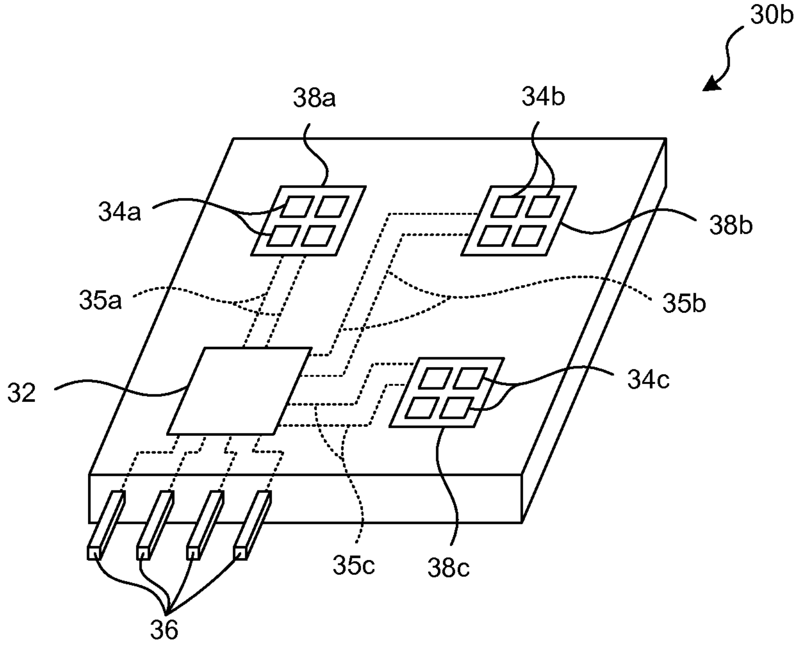
FIG. 1D (Prior Art)
Figure 2:
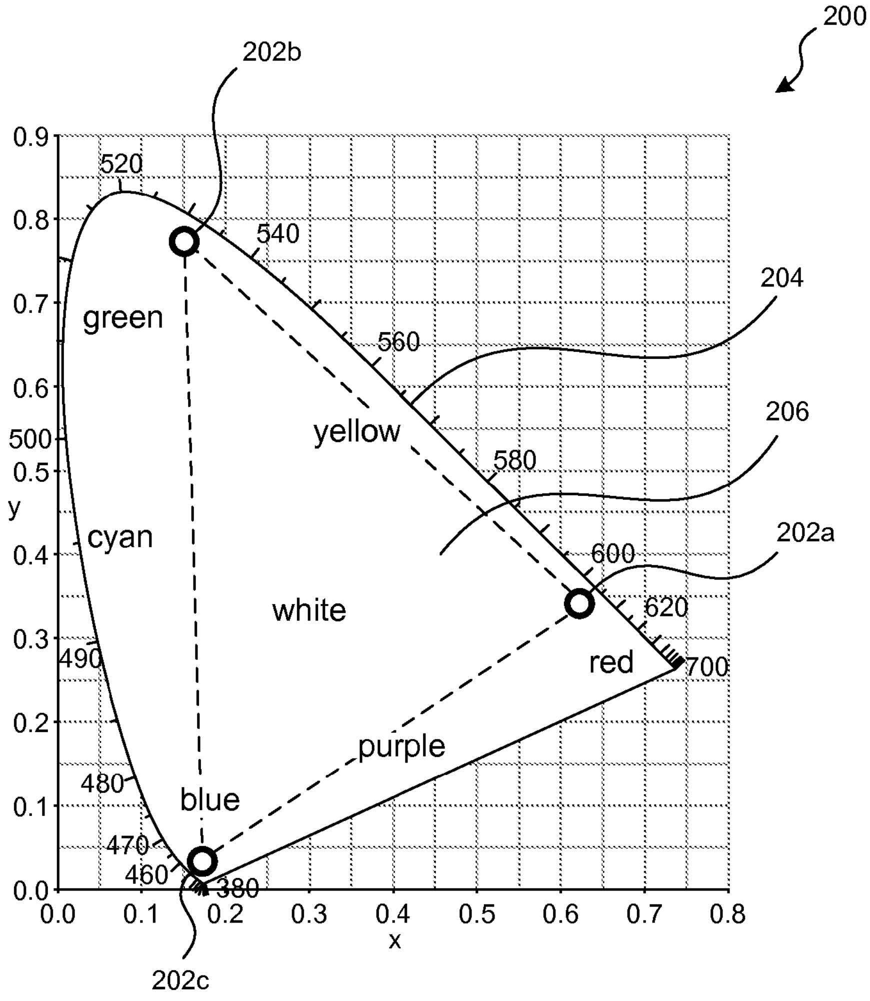
FIG. 2 (Prior Art)
FIG. 2 is an illustration of a chromaticity diagram having chromaticity points in accordance with the prior art.

FIG. 2 is an illustration of a chromaticity diagram 200 having a plurality of chromaticity points chosen in accordance with the prior art. The chromaticity diagram 200 includes the CIE 1931 color space having a curved spectral locus 204. The spectral locus 204 corresponds to monochromatic light and is annotated with wavelength values in nanometers. The area within the spectral locus 204 represents the range of human vision. LED devices in accordance with the prior art often include multiple emitters, each producing monochromatic, or near monochromatic light. Although most LEDs generally produce light that appears monochromatic to the eye, no existing LED is truly monochromatic. That is, all LEDs, even those described as monochromatic, have a non-zero spectral line width. LEDs that are close to the spectral locus 204 are generally termed monochromatic, and have color purities very close to 100%, and at least greater than 90%. However, phosphor or other converter materials that can be used in conjunction with an LED include color purities greater than 60% and can also be considered monochromatic. Accordingly, the term monochromatic, as used herein, is taken to mean near monochromatic and/or having a relatively high color purity.

As shown in FIG. 2, a first chromaticity point 202*a* for a first emitter includes monochromatic red light, a second chromaticity point 202*b* for a second emitter includes monochromatic green light and a third chromaticity point 202*c* for a third emitter includes monochromatic blue light. The chromaticity points 202*a*, 202*b* and 202*c* (collectively, chromaticity points 202) define a color space 206 having a generally triangular shape.

An LED or SST device constructed with emitters having chromaticities corresponding to the chromaticity points 202 can theoretically produce any color of light within the color space 206. However, most multiple emitter SST devices create desired chromaticities by using control systems with variable DC current or pulse width modulation (PWM) to change the intensity or brightness of the individual emitters. The number of available levels of brightness for each emitter is therefore dependent on the number of available signals within the control system used. For example, a system employing 8-bit PWM provides 256 ($2^{8}$) possible levels of brightness for each emitter. Accordingly, the available chromaticity points of such systems are limited by the available combinations of brightness levels for each emitter. For an LED device having emitters with the chromaticity points 202 shown in FIG. 2, the available chromaticity points for emitted light include a subset of the color space 206. Depending on the choice of chromaticity points 202, a particular chromaticity may not be an available option for a given SST device. The closer an achievable chromaticity point is to the desired point, the greater the color fidelity of the SST device.

Figure 3B:
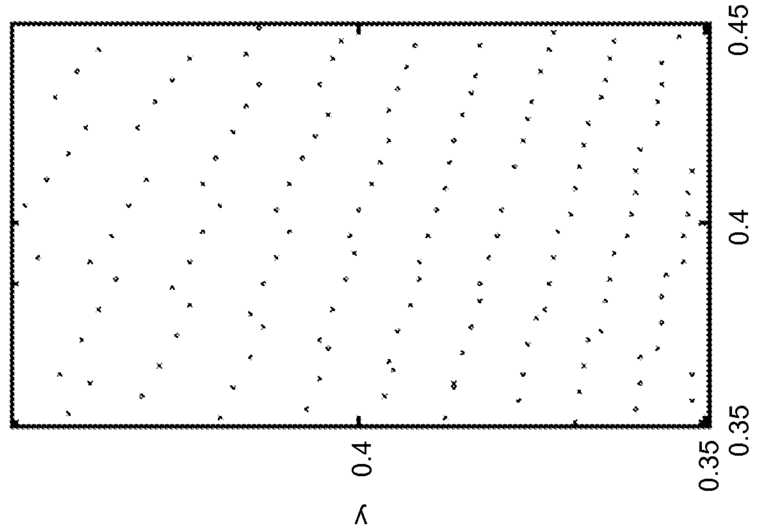
FIG. 3B (Prior Art)
FIGS. 3A and 3B are portions of the CIE 1931 color space illustrating available chromaticities for an SST device in accordance with the prior art.
Figure 3A:
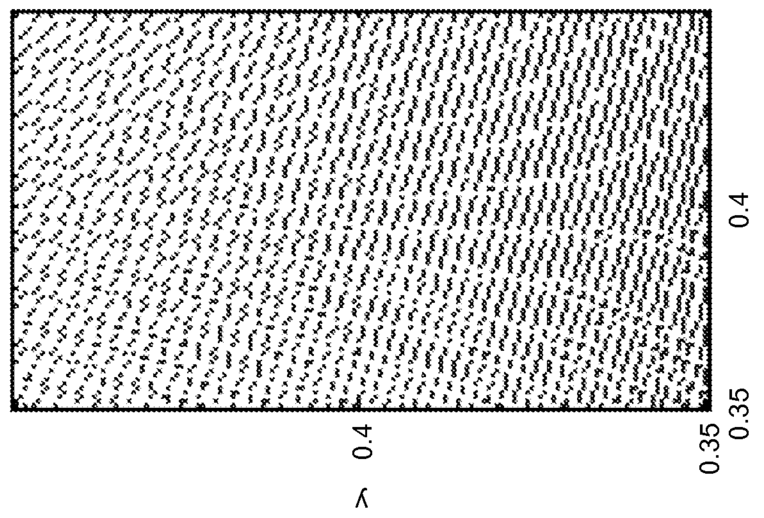
FIG. 3A (Prior Art)

The overall brightness level that is desired for a given chromaticity point can further limit the color fidelity of an SST device. For example, at low brightness levels, the available chromaticity points are reduced. FIGS. 3A and 3B are portions of the CIE 1931 color space illustrating available chromaticities for a particular SST device operated at different brightness levels. The points in the color space of FIGS. 3A and 3B represent the available chromaticities for a three-emitter device using 7-bit PWM and having chromaticity coordinates similar to those of the chromaticity points 202 of FIG. 2. Particularly, the chromaticity coordinates for an SST device having the characteristics shown in FIGS. 3A and 3B are (0.16, 0.03), (0.20, 0.80), and (0.65, 0.34). FIG. 3A illustrates the available chromaticities for a brightness level between 50-51%, while FIG. 3B illustrates the available chromaticities for a brightness level between 10-11%. As can be seen by comparing FIG. 3A to FIG. 3B, the number of available chromaticities, and hence the density of available chromaticities, is greatly reduced in FIG. 3B. Accordingly, an SST device using similar PWM and having emitters with similar chromaticity coordinates provides relatively poor color fidelity at low brightness levels.

Figure 4:
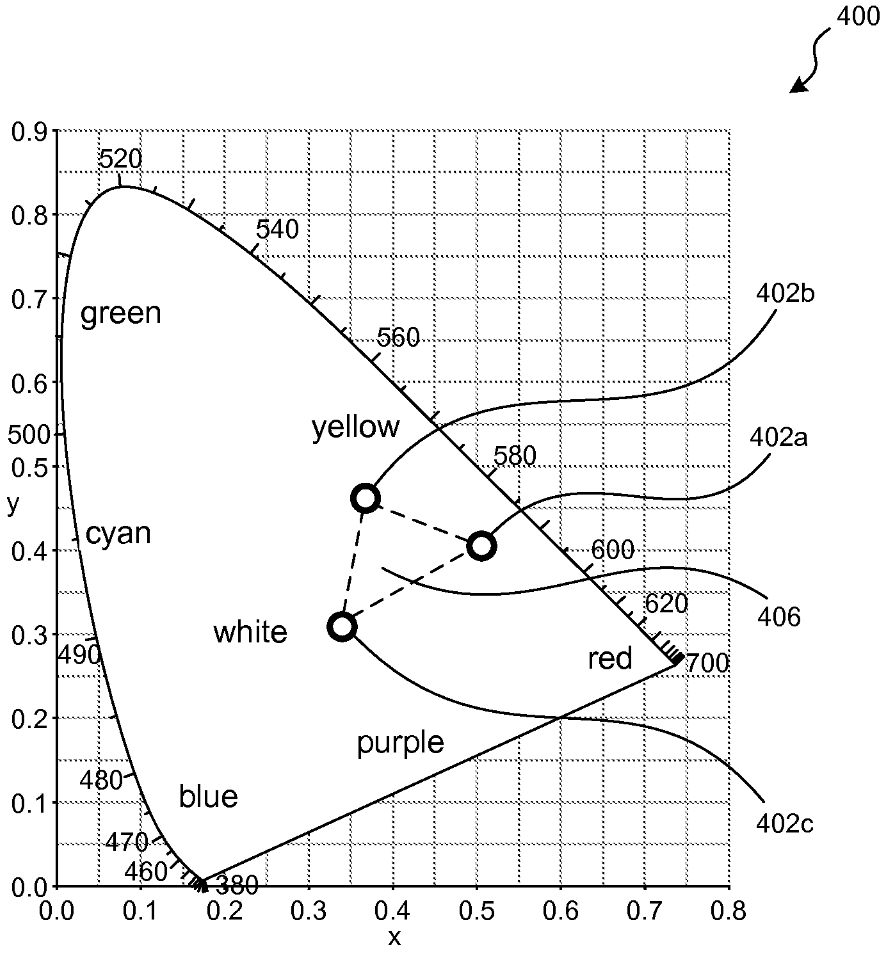
FIG. 4 is an illustration of a chromaticity diagram having a plurality of chromaticity points in accordance with an embodiment of the present technology.

FIG. 4 is an illustration of a chromaticity diagram 400 having a plurality of chromaticity points in accordance with an embodiment of the present technology. In the illustrated embodiment, a first chromaticity point 402*a* for a first emitter includes polychromatic red/yellow light. A second chromaticity point 402*b* for a second emitter includes polychromatic green/yellow light and a third chromaticity point 402*c* for a third emitter includes polychromatic blue/white light. The chromaticity points 402*a*, 402*b*, 402*c* (collectively chromaticity points 402) define a color space 406 having a triangular shape similar to the color space 206 of FIG. 2. However, the color space 406 occupies a much smaller area of the visual range. In the illustrated embodiment, the difference between the x coordinates or y coordinates of any of the chromaticity points 402 is less than 0.3, and the distance between any of the two chromaticity points is also less than 0.3. In other embodiments, the distance and/or the difference may be greater or less than 0.3, but generally the chromaticity points 402 define a color space 406 occupying a smaller area of the visual range than the color space defined by monochromatic emitters. Accordingly, for a given number of available brightness levels, an SST device having the chromaticity points 402 provides a higher density of available chromaticities, as will be described further below.

Figure 5B:
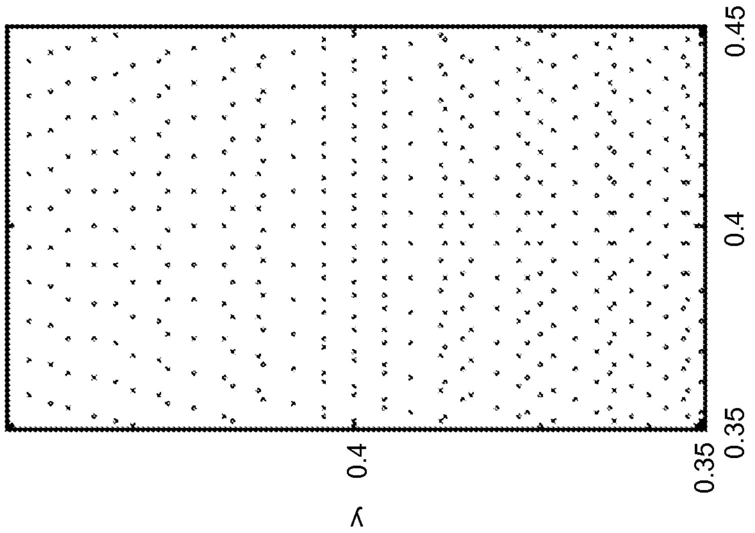
FIGS. 5A and 5B are portions of the CIE 1931 color space illustrating available chromaticities for an SST device having three emitters configured in accordance with a further embodiment of the present technology.
Figure 5A:
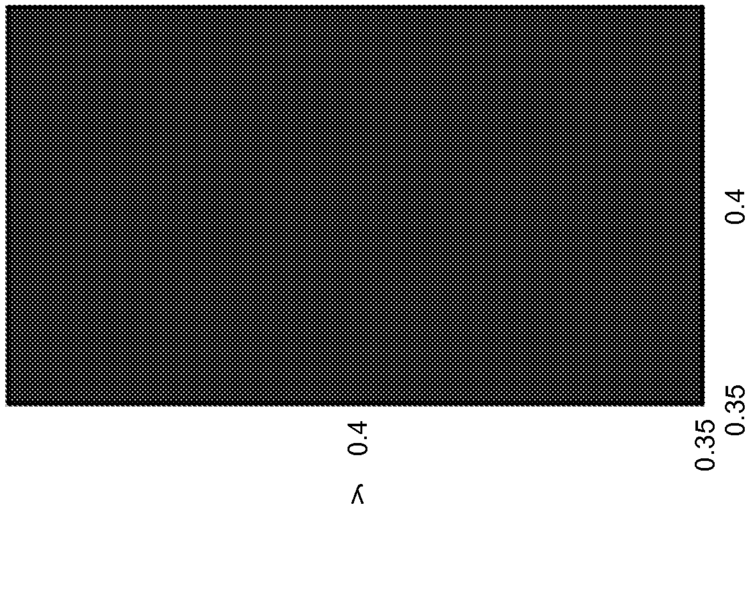

Similar to FIGS. 3A and 3B, FIGS. 5A and 5B are portions of the CIE 1931 color space illustrating available chromaticities for an SST device. However, FIGS. 5A and 5B illustrate the available chromaticities for a three-emitter device having 7-bit PWM and chromaticity coordinates similar to those of the chromaticity points 402 of FIG. 4, in accordance with the present technology. More specifically, the chromaticity coordinates for an SST device having the characteristics shown in FIGS. 5A and 5B are (0.25, 0.25), (0.40, 0.55), and (0.55, 0.25). As with FIGS. 3A and 3B, FIG. 5A corresponds to a brightness level between 50-51%, while FIG. 5B corresponds to a brightness level between 10-11%. Comparing FIGS. 5A and 5B to FIGS. 3A and 3B, the density and uniformity of available chromaticities is significantly increased by selecting the chromaticity points 402 shown in FIG. 4. In particular, as shown in FIG. 5B, the chromaticity points 402 provide a relatively high and uniform density at the lower brightness level. Accordingly, the chromaticity points 402 provide a relatively high color fidelity compared to prior art systems.

Figure 6:
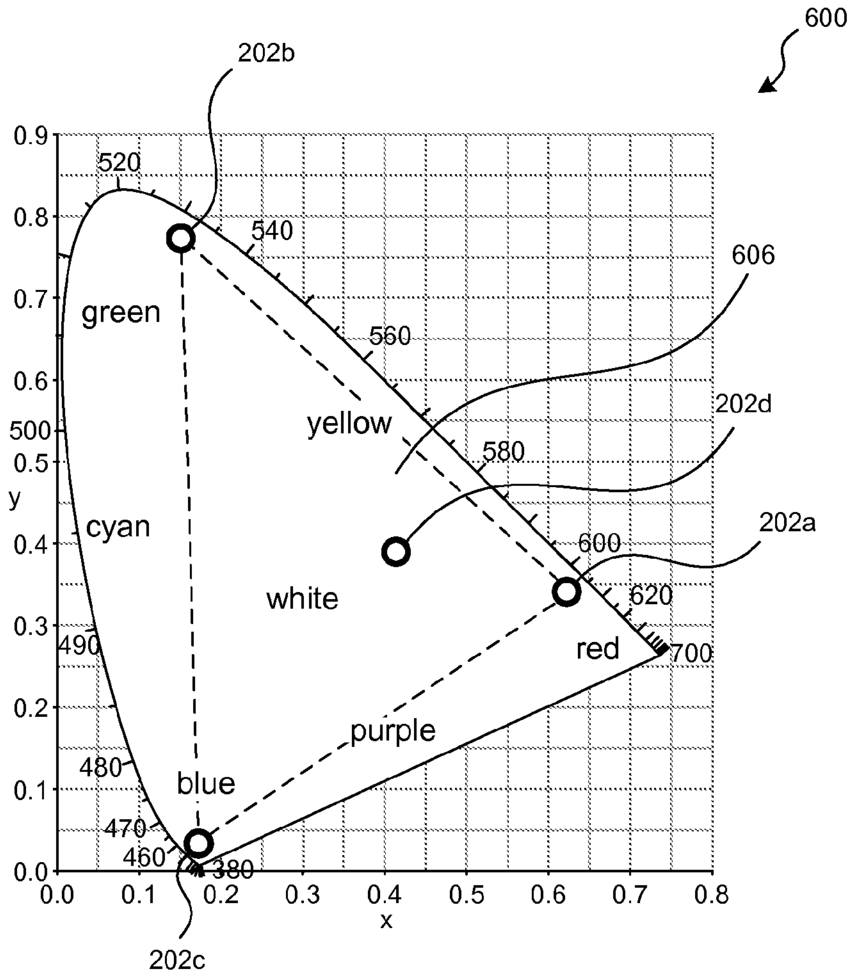
FIG. 6 is an illustration of a chromaticity diagram having a plurality of chromaticity points in accordance with yet another embodiment of the present technology.

In a further embodiment, an SST device can include additional emitters to provide increased color fidelity. FIG. 6 is an illustration of a chromaticity diagram 600 illustrating the chromaticities of multiple steering emitters and a bias emitter in accordance with another embodiment of the present technology. The chromaticity diagram 600 includes the chromaticity points 202*a*, 202*b* and 202*c* (collectively, chromaticity points 202) corresponding to a first steering emitter, a second steering emitter and a third steering emitter, respectively. The chromaticity points 202 define a color space 606, and a fourth chromaticity point 202*d* corresponds to a fourth or bias emitter having a chromaticity within the color space 606. For example, the steering emitters can each be monochromatic, and the bias emitter can be polychromatic. Additionally, the bias emitter can be configured to have a maximum brightness that is greater than that of the steering emitters. As described further below, the addition of the bias emitter results in the available chromaticities for given brightness levels being concentrated in a smaller area, and thereby increases color fidelity.

Figure 7B:
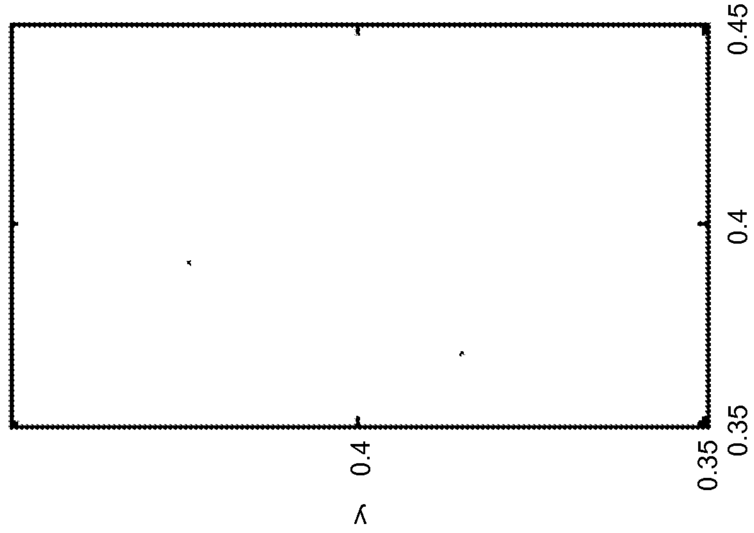
FIG. 7B (Prior Art)
FIGS. 7A and 7B are portions of the CIE 1931 color space illustrating available chromaticities for an SST in accordance with the prior art.
Figure 7A:
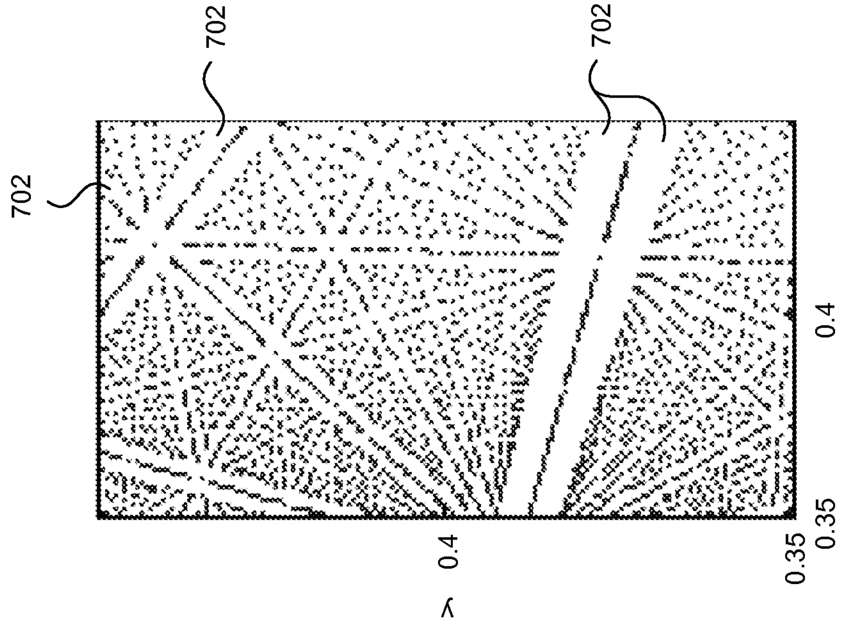
FIG. 7A (Prior Art)

FIGS. 7A and 7B are portions of the CIE 1931 color space illustrating available chromaticities for an SST device having 5-bit PWM and three monochromatic emitters. Specifically, the chromaticity coordinates for the three emitters are (0.16, 0.03), (0.20, 0.80) and (0.65, 0.34). In FIG. 7A the available chromaticity points correspond to a brightness level between 50-51%, while FIG. 7B corresponds to a brightness level between 10-11%. As shown in FIG. 7A, the color space has multiple bands 702 with no available chromaticities. In FIG. 7B, the relatively low brightness level provides a very limited number of available states, with large areas having no available color states at all.

Figure 8B:
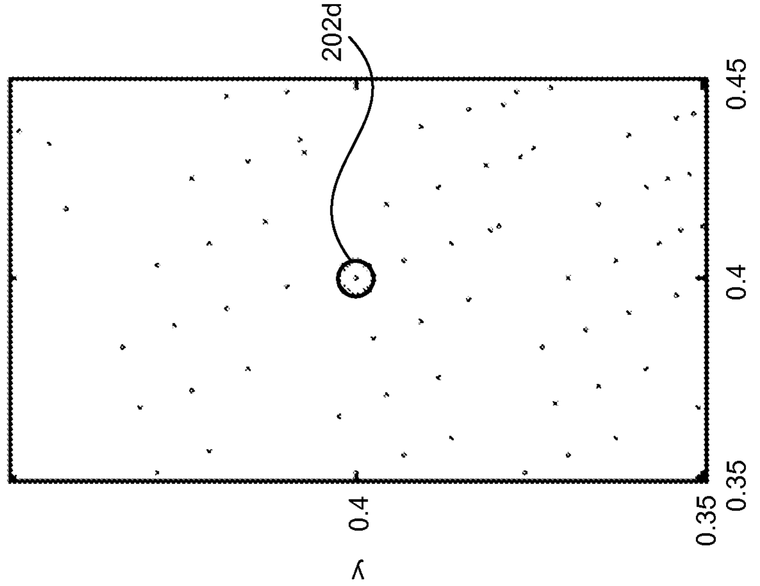
FIGS. 8A and 8B are portions of the CIE 1931 color space illustrating available chromaticities for an SST device having three steering emitters and a bias emitter configured in accordance with a further embodiment of the present technology.
Figure 8A:
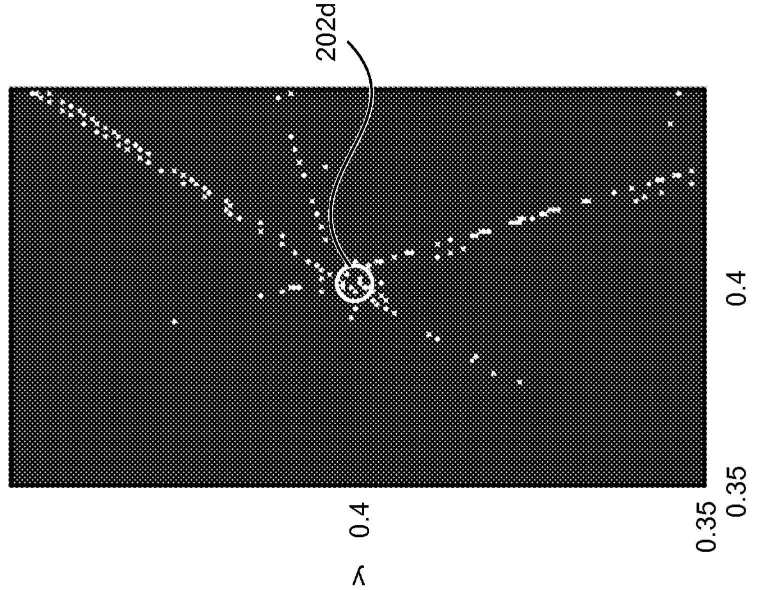

FIGS. 8A and 8B are portions of the CIE 1931 color space for a four-emitter SST device having three steering emitters with chromaticity coordinates corresponding to the three emitters of FIGS. 7A and 7B. In addition, the four-emitter device of FIGS. 8A and 8B includes a bias emitter having chromaticity coordinates of (0.4, 0.4) corresponding to the chromaticity point 202*d* (i.e., a non-monochromatic or polychromatic emitter). FIG. 8A illustrates the available chromaticity coordinates for a brightness level between 50-51% and FIG. 8B illustrates the corresponding coordinates for a brightness level between 10-11%. As can be seen by comparing FIG. 7A to FIG. 8A and FIG. 7B to FIG. 8B, the bias emitter greatly increases the number of available chromaticity points. More particularly, at the low brightness level between 10-11%, the bias emitter increases the available chromaticity points and the uniformity with which the points are distributed, and can accordingly significantly decrease the size of any areas that lack available states. As a result, devices in accordance with the present technology that employ a polychromatic bias emitter in conjunction with steering emitters can provide increased color fidelity.

Figure 9:
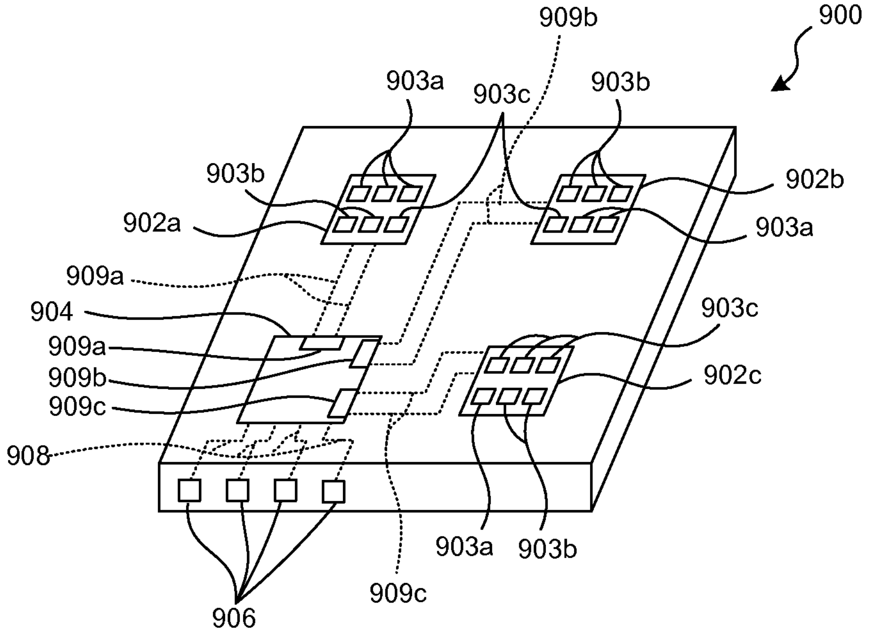
FIG. 9 is a partially schematic isometric view of an SST device having three emitters configured in accordance with another embodiment of the present technology.

Emission systems or SST devices incorporating polychromatic emitters as disclosed herein can be constructed in any of a variety of suitable configurations. FIG. 9 is a partially schematic isometric view of a multiple emitter SST device 900 configured in accordance with an embodiment of the present technology. The SST device 900 can include a variable output controller 904 and a plurality of polychromatic emitters 902, e.g., a polychromatic first emitter 902*a*, a polychromatic second emitter 902*b* and a polychromatic third emitter 902*c*. The controller 904 can be connected to external contacts 906 through leads 908 to receive power and operational signals. The controller 904 can include individual channels 909 for each emitter 902. For example, the individual SSTs 902*a*, 902*b* and 902*c* can be connected to corresponding channels 909*a*, 909*b* and 909*c*, respectively, with conductive traces, leads or other signal transmission elements. The functions performed by the controller 904 can include, but are not limited to, generating individually varying signals on individual channels 909. In the illustrated embodiment, the first emitter 902*a* includes three red SSTs 903*a*, two green SSTs 903*b* and one blue SST 903*c*. The combination of SSTs 903*a*, 903*b*, 903*c* can produce a chromaticity at least similar to the chromaticity point 402*a* of FIG. 4. Similarly, the second emitter 902*b* and the third emitter 902*c* can each include a plurality of SSTs 903 (e.g., 903*a*, 903*b*, 903*c*) to produce chromaticities at or near that of the chromaticity points 402*b* and 402*c*, respectively, of FIG. 4. By varying the signals on the channels 909 to the individual SSTs 902, the SST device 900 can produce overall chromaticities at least similar to those discussed with respect to the color space 406 of FIG. 4 and the available chromaticities of FIG. 5A and FIG. 5B. Accordingly, the SST device 900 can operate with greater color fidelity at low brightness levels than can a similar device having only monochromatic emitters.

Although the illustrated embodiment includes three emitters, each having six SSTs, those skilled in the art will understand that other embodiments in accordance with the present technology may include additional or fewer emitters and/or SSTs. For example, four polychromatic emitters, each having five SSTs can define a color space having similar properties to the color space 406 described above with respect to FIG. 4. Additionally, polychromatic emitters of the present technology may include SSTs having converter materials or elements that convert a received first wavelength to an emitted second wavelength. For example, the SST device 900 can include emitters 902 having individual polychromatic SSTs including doped yttrium aluminum garnet (YAG) (e.g., cerium doped YAG) capable of emitting a range of colors via photoluminescence.

Figure 10:
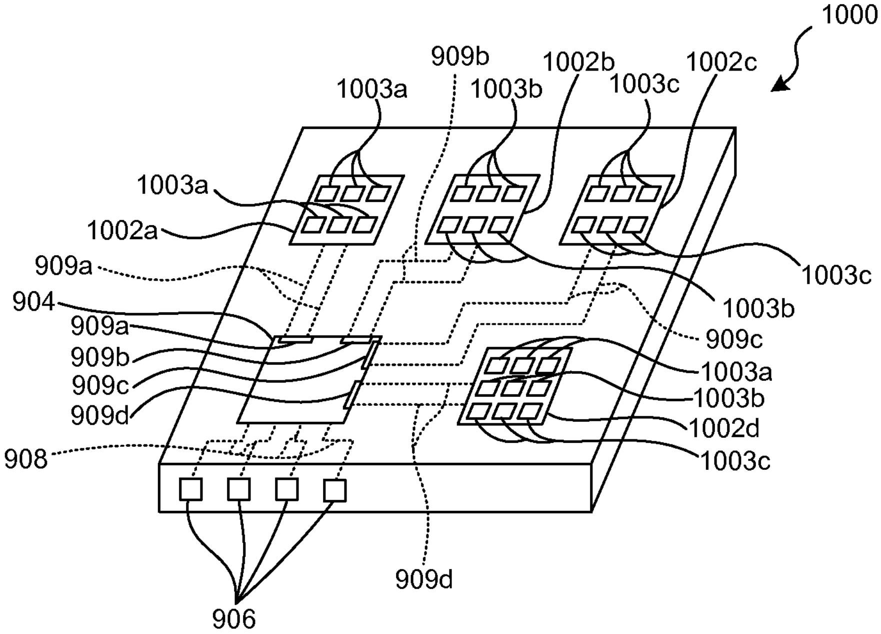
FIG. 10 is a partially schematic isometric view of an SST device having three steering emitters and a bias emitter configured in accordance with a further embodiment of the present technology.

FIG. 10 is a partially schematic isometric view of an SST device 1000 having multiple emitters configured in accordance with a further embodiment of the present technology. Similar to the SST device 900, the SST device 1000 can include a controller 904, leads 908 and external contacts 906. Additionally, the SST device 1000 can include multiple emitters 1002, e.g., a first steering emitter 1002*a*, a second steering emitter 1002*b* and a third steering emitter 1002*c*. In the illustrated embodiment, the first steering emitter 1002*a* includes a plurality of red SSTs 1003*a*, and the second and third steering emitters 1002*b*, 1002*c* each include a plurality of green SSTs 1003*b* and blue SSTs 1003*c*, respectively. The steering emitters 1002*a*, 1002*b* and 1002*c* can have chromaticity coordinates similar to the chromaticity points 202*a*, 202*b* and 202*c*, respectively, of FIG. 6. The SST device 1000 can further include a polychromatic bias emitter 1002*d* having a combination of SSTs 1003, e.g., three red SSTs 1003*a*, three green SSTs 1003*b* and three blue SSTs 1003*c*. In the illustrated embodiment, the bias emitter 1002*d* includes more LEDs than the individual steering emitters 1002*a*, 1002*b* and 1002*c* so as to produce a higher overall brightness level.

The bias emitter 1002*d* can be chosen to have a chromaticity at or near a targeted overall chromaticity of the SST device 1000. For example, the combination of the SSTs 1003 of the bias emitter 1002*d* can correspond to an overall chromaticity with coordinates similar to the chromaticity point 202*d* of FIG. 6. The emitters 1002 (e.g., the steering emitters 1002*a*, 1002*b*, 1002*c* and the bias emitter 1002*d*) can be connected to corresponding channels 909 (e.g., channels 909*a*, 909*b*, 909*c* and 909*d*, respectively) of the controller 904. The controller 904 can generate signals on the channels 909 to produce chromaticities at least similar to those discussed with respect to the color space 606 of FIG. 6 and the available chromaticities of FIGS. 8A and 8B. For example, the controller 904 can direct the steering emitters to adjust or "pull" the overall output of the SST device 1000 toward the target chromaticity, if the output would otherwise deviate from the target output. This technique can be particularly effective at low light levels, for which the density of available chromaticities is less. Because the steering emitters can have a lower output than the bias emitter(s), they can provide relatively small adjustments to the overall chromaticity without causing the chromaticity to deviate significantly from the target value. Accordingly, the SST device 1000 operates with greater color fidelity than similar devices employing only monochromatic emitters.

In a manner generally similar to the emitters 902 described above with reference to FIG. 9, the emitters 1002 (e.g., the steering emitters 1002*a*, 1002*b*, 1002*c* and the bias emitter 1002*d*) can include a converter material to convert a received first wavelength to an emitted second wavelength. For the steering emitters 1002*a*, 1002*b*, 1002*c*, the converter material can be configured to convert a majority of light emitted by the emitters 1002*a*, 1002*b*, 1002*c*. Accordingly, the steering emitters 1002*a*, 1002*b*, 1002*c* can include converter material and still produce monochromatic light. Additionally, the converter material can be applied to the bias emitter 1002*d*, with some or all of the LEDs 1003*a*, 1003*b*, 1003*c* to produce polychromatic light. As discussed above, cerium doping and/or other converter materials can be used to produce a second wavelength of light from the LEDs 1003*a*, 1003*b*, 1003*c*.

Figure 11:
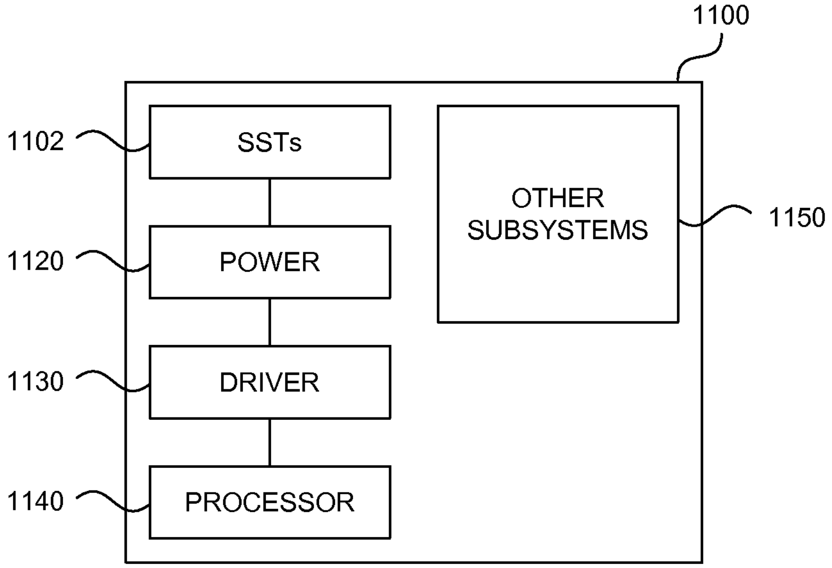
FIG. 11 is a schematic diagram of an SST device having multiple components configured in accordance with an embodiment of the present technology.

In addition to the SST devices 900 and 1000 described above with reference to FIGS. 9 and 10, lighting or emission systems configured in accordance with the present technology can include a variety of larger and/or more complex systems. For example, FIG. 11 is a schematic diagram of an SST device 1100 having additional components configured in accordance with an embodiment of the present technology. The SST device 1100 includes a plurality of SSTs 1102 that can provide emitted light exhibiting chromaticities similar to those described above with reference to FIG. 9 and/or FIG. 10. In addition, the SST device 1100 can include a power source 1120, a driver 1130, a processor 1140, and/or other components or subsystems 1150. The resulting SST device 1100 can perform any of a wide variety of functions, such as backlighting, general illumination, and/or other functions. Accordingly, the SST device 1100, or other devices incorporating the SST device 1100 can include, without limitation, lighting fixtures, computer screens, televisions, light bulbs, hand-held devices (e.g., cellular or mobile phones, tablets, digital readers, and digital audio players, remote controls, and appliances (e.g., refrigerators). Components of the SST device 1100 may be housed in a single unit or distributed over multiple, interconnected units (e.g., through a communications network).

In some embodiments, the SST devices 900, 1000, and 1100 shown in FIGS. 9, 10 and 11 can include computer readable memory and/or processors. The computer readable memory and processors can be integral with components described above (e.g., integral with the controller 904 shown in FIGS. 9 and 10), or they can be separate components within the SST devices 900, 1000, and 1100. The computer readable memory can store computer-executable instructions, including routines executed by the processor. Those skilled in the relevant art will appreciate that aspects of the technology can be practiced on systems other than those shown and described herein. The technology can be embodied in special-purpose processors or components that are specifically programmed, configured or constructed to perform one or more of the computer-executable instructions to control SSTs in the manner described herein.

As described above, the SST devices 900, 1000, and 1100 can be configured to operate with varying DC current or PWM systems. Increasing the available signals (or number of bits) in a PWM system can increase the available chromaticities of light for an SST device at any given value of brightness level, but simultaneously increases the complexity and cost of the device. As shown above, the SST devices 900, 1000, and 1100 can produce relatively high color fidelity using 5 or 7-bit PWM systems at 10-11% brightness levels. In other embodiments, the SST devices 900, 1000, and 1100 can produce relatively high color fidelity at lower brightness levels. For example, SST devices constructed in accordance with the present technology can produce relatively high color fidelity at brightness levels less than 5%.

From the foregoing, it will be appreciated that specific embodiments of the technology have been described herein for purposes of illustration, but that various modifications may be made without deviating from the disclosure. The SST devices 900, 1000 and 1100 can include additional components or features, and/or different combinations of the components or features described herein. For example, polychromatic emitters may include SSTs having differing types of quantum wells within an individual SST to produce polychromatic emissions, or having quantum dots or quantum wires to convert a first received wavelength to a second emitted wavelength. Additionally, although the illustrated embodiments include SST devices having three emitters on three channels or four emitters on four channels, other embodiments may include fewer or additional emitters and/or channels. In one embodiment, for example, an SST device can include two emitters on two channels. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. An emission system for producing a target chromaticity, the system comprising:

a first emitter having a first plurality of solid-state transducers (SSTs) positioned to emit light having a first chromaticity;

a second emitter having a second plurality of SSTs positioned to emit light having a second chromaticity different than the first chromaticity; and a controller having:

a first channel with a variable output, coupled to the first emitter to adjust a brightness level of the first emitter;

a second channel with a variable output, coupled to the second emitter to adjust a brightness level of the second emitter; and a computer readable memory storing instructions for controlling the variable output of the first channel and the variable output of the second channel, the instructions directing— a first set of signals to the first emitter and the second emitter to produce a combined chromaticity at a first brightness level; and a second set of signals to the first emitter and the second emitter to produce the combined chromaticity at a second brightness level, wherein the second brightness level is 50% or less of the first brightness level.

2. The emission system of claim 1, further comprising a third emitter having a third plurality of SSTs positioned to emit light having a third chromaticity different than the first chromaticity and the second chromaticity, and wherein— the controller further has a third channel with a variable output, coupled to the third emitter to adjust the brightness level of the third emitter;

the controller directs pulse width modulated signals having a fixed number of bits to the first channel, the second channel and the third channel;

at least one individual SST includes a converter material to convert a received wavelength to an emitted wavelength, the received wavelength being different than the emitted wavelength; and the first emitter, the second emitter and the third emitter are polychromatic and the first chromaticity, the second chromaticity, and the third chromaticity define a color space having a range of color fidelity over a given range of brightness greater than the color fidelity of an emission system having the variable output controller and three monochromatic emitters, wherein the instructions direct the first set of signals to the first emitter, the second emitter and the third emitter to produce the combined chromaticity at the first brightness level, and wherein the instructions direct the second set of signals to the first emitter, the second emitter and the third emitter to produce the combined chromaticity at the second brightness level.

3. The system of claim 2 wherein the distance between chromaticity coordinates for any two of the first emitter, the second emitter, and the third emitter is less than 0.3 in the CIE 1931 color space.

4. The emission system of claim 1, further comprising a third emitter having a third plurality of SSTs positioned to emit light having a third chromaticity different than the first chromaticity and the second chromaticity, wherein the controller further has a third channel with a variable output, coupled to the third emitter to adjust the brightness of the third emitter, wherein the first emitter, the second emitter and the third emitter are polychromatic and the first chromaticity, the second chromaticity, and the third chromaticity define a color space having a range of color fidelity over a given range of brightness greater than the color fidelity of an emission system having the variable output controller and three monochromatic emitters, wherein the instructions direct the first set of signals to the first emitter, the second emitter and the third emitter to produce the combined chromaticity at the first brightness level, and wherein the instructions direct the second set of signals to the first emitter, the second emitter and the third emitter to produce the combined chromaticity at the second brightness level.

5. The system of claim 4 wherein the variable output controller provides 8-bit pulse width modulated signals.

6. The system of claim 4 wherein the difference between an x chromaticity coordinate or a y chromaticity coordinate of any two of the first emitter, the second emitter, and the third emitter is less than 0.3 in the CIE 1931 color space.

7. A method for forming an emission system, the method comprising:

selecting a first group of SSTs to form a first polychromatic emitter that emits light having a first chromaticity, wherein at least two different SSTs of the first group of SSTs emit different wavelengths of light;

selecting a second group of SSTs to form a second polychromatic emitter that emits light having a second chromaticity different than the first chromaticity, wherein at least two different SSTs of the second group of SSTs emit different wavelengths of light;

coupling a controller to the first and second group of SSTs, the controller having instructions for providing:

a first set of signals to the first polychromatic emitter and the second polychromatic emitter to produce light having a combined chromaticity at a first brightness level; and a second set of signals to the first polychromatic emitter and the second polychromatic emitter to produce light having the combined chromaticity at a second brightness level different than the first brightness level, wherein the second brightness level is 50% or less of the first brightness level.

8. The method of claim 7 wherein the second brightness level is 5% or less of the first brightness level.

9. The method of claim 7 wherein at least one of selecting a first group of SSTs and selecting a second group of SSTs includes selecting at least one SST having a first quantum well for emitting a first wavelength of light and a second quantum well for emitting a second wavelength of light.

10. The method of claim 7, further comprising selecting a third group of SSTs to form a third polychromatic emitter that emits light having a third chromaticity different than the first chromaticity and the second chromaticity, wherein at least two different SSTs of the third group of SSTs emit different wavelengths of light, and wherein:

providing the first set of signals includes providing the first set of signals to the first emitter, the second emitter and the third emitter to produce light having the combined chromaticity at the first brightness level; and providing the second set of signals includes providing the second set of signals to the first emitter, the second emitter and the third emitter to produce light having the combined chromaticity at the second brightness level different than the first brightness level.

11. An SST device for producing a target chromaticity over a range of brightness levels, the SST device comprising:

a plurality of steering emitters, with individual steering emitters having at least one SST positioned to produce monochromatic light, and with chromaticity points of the individual steering emitters defining a color space within the CIE 1931 color space;

a bias emitter having at least one SST positioned to produce polychromatic light, the bias emitter having a chromaticity point within the color space defined by the steering emitters; and a controller including:

a plurality of channels, with individual channels having a variable output and coupled to a corresponding individual steering emitter or the bias emitter for adjusting the brightness level of the corresponding individual steering emitter or the bias emitter to produce a combined chromaticity that at least approximates the target chromaticity; and instructions for producing the combined chromaticity at a first brightness level and at a second brightness level that is 50% or less of the first brightness level.

12. The SST device of claim 11 wherein the variable output of an individual channel includes a pulse width modulated signal having a fixed number of available values.

13. The SST device of claim 11 wherein at least one of the SSTs includes a converter material.

14. The SST device of claim 11 wherein the second brightness level is less than 5% of the first brightness level.

15. The SST device of claim 11 wherein the bias emitter has a first maximum brightness level and the individual steering emitters have a second maximum brightness level, and wherein the first maximum brightness level is greater than the second maximum brightness level.

16. The SST device of claim 11 wherein individual steering emitters further include a plurality of SSTs and the bias emitter further includes a plurality of SSTs, the plurality of SSTs of the bias emitter including a greater number of individual SSTs than the plurality of SSTs of any individual steering emitter.

17. An SST device having a plurality of emitters, the SST device comprising:

a variable output controller;

a first emitter having a first SST positioned to produce light having a first chromaticity, the first emitter operably coupled to the variable output controller and having a first maximum brightness level;

a second emitter having a second SST positioned to produce light having a second chromaticity, the second emitter operably coupled to the variable output controller and having a second maximum brightness level;

a third emitter having a third SST positioned to produce light having a third chromaticity, the third emitter operably coupled to the variable output controller and having a third maximum brightness level; and a fourth emitter having a fourth SST positioned to produce light having a fourth chromaticity, the fourth emitter operably coupled to the variable output controller and having a fourth maximum brightness level, the fourth maximum brightness level greater than the first maximum brightness level, the second maximum brightness level and the third maximum brightness level, and wherein— the fourth chromaticity lies within the bounds of a triangle formed by the first chromaticity, the second chromaticity, and the third chromaticity in the CIE 1931 color space;

the first chromaticity, the second chromaticity, the third chromaticity and the fourth chromaticity produce a range of color fidelity over a given range of brightness greater than the color fidelity of an emission system having the variable output controller and three monochromatic emitters; and the variable output controller is operable to produce:

a first combined brightness level from the first emitter, the second emitter, the third emitter and the fourth emitter; and a second combined brightness level from the first emitter, the second emitter, the third emitter and the fourth emitter, wherein the second combined brightness level is 50% or less of the first combined brightness level.

18. The SST device of claim 17 wherein the fourth emitter further comprises a converter element, and wherein the fourth emitter is polychromatic.

19. The SST device of claim 17 wherein the first emitter, the second emitter, and the third emitter are monochromatic.

20. The SST device of claim 17 wherein the first emitter, the second emitter and the third emitter are monochromatic and include a converter material.

21. An emission device for emitting a target chromaticity, the device comprising:

a first steering emitter having a first plurality of SSTs;

a second steering emitter having a second plurality of SSTs;

a third steering emitter having a third plurality of SSTs, wherein the color purities of the first steering emitter, the second steering emitter and the third steering emitter are greater than 90%;

a bias emitter having a fourth plurality of SSTs; and a variable output controller operably coupled to the first steering emitter, the second steering emitter, the third steering emitter and the bias emitter for adjusting a brightness level of each of the first steering emitter, the second steering emitter, the third steering emitter and the bias emitter, wherein the brightness levels of the first steering emitter, the second steering emitter, the third steering emitter and the bias emitter are variable to produce a first combined brightness level and a second combined brightness level, and wherein the second combined brightness level is 50% or less of the first combined brightness level.

22. The emission device of claim 21 wherein the variable output controller includes a finite number of output states for adjusting the brightness level of the first steering emitter, the second steering emitter, the third steering emitter and the bias emitter.

23. The emission device of claim 21 wherein at least one individual SST of the first plurality of SSTs, the second plurality of SSTs, the third plurality of SSTs or the fourth plurality of SSTs includes a converter material.

24. The emission device of claim 21 wherein the fourth plurality of SSTs includes a greater number of individual SSTs than the first plurality of SSTs, the second plurality of SSTs, or the third plurality of SSTs.

25. A light-emitting diode (LED) device for producing a target chromaticity over a range of brightness levels, the LED device comprising:

a plurality of steering LEDs, with individual steering LEDs positioned to produce monochromatic light, and with chromaticity points of the individual steering LEDs defining a color space within the CIE 1931 color space;

a bias emitter having multiple LEDs positioned to produce polychromatic light, the bias emitter having a chromaticity point within the color space defined by the steering LEDs; and a controller having a plurality of channels, with individual channels having a variable output and coupled to at least one corresponding steering LED or the bias emitter for adjusting the brightness level of the corresponding steering LED or the bias emitter to produce a combined chromaticity that at least approximates the target chromaticity over a variable combined brightness level, wherein the variable combined brightness level includes a first combined brightness level and a second combined brightness level, and wherein the second combined brightness level is 50% or less of the first combined brightness level.

26. The LED device of claim 25 wherein the plurality of steering LEDs includes a first plurality of LEDs producing monochromatic light at a first chromaticity point, a second plurality of LEDs producing monochromatic light at a second chromaticity point, different than the first chromaticity point, and a third plurality of LEDs producing monochromatic light at a third chromaticity point different than the first and second chromaticity points.

27. The LED device of claim 25 wherein the variable output of an individual channel includes a pulse width modulated signal having a fixed number of available values.

28. The LED device of claim 25 wherein one or more of the LEDs includes a converter material.

29. The LED device of claim 25 wherein the variable combined brightness level is variable from a maximum to less than 5% of the maximum.

30. The LED device of claim 25 wherein the bias emitter has a first maximum brightness level and the individual steering LEDs have a second maximum brightness level, and wherein the first maximum brightness level is greater than the second maximum brightness level.

* * * * *